United States Patent [19]
Singh

[11] Patent Number: 6,043,702
[45] Date of Patent: Mar. 28, 2000

[54] DYNAMIC BIASING FOR OVERSHOOT AND UNDERSHOOT PROTECTION CIRCUITS

[75] Inventor: Gajendra P. Singh, Sunnyvale, Calif.

[73] Assignee: Sun Microsystems, Inc., Palo Alto, Calif.

[21] Appl. No.: 09/015,378

[22] Filed: Jan. 29, 1998

[51] Int. Cl.[7] .............................................. H03K 19/003
[52] U.S. Cl. .......................... 327/534; 327/537; 327/309; 327/312; 327/108; 326/33; 326/34; 326/27
[58] Field of Search ...................... 327/108, 546, 327/379, 384, 380, 309, 534, 321, 537, 312; 361/111; 326/27, 30, 33, 34

[56] References Cited

U.S. PATENT DOCUMENTS

| | | | |
|---|---|---|---|
| 5,347,169 | 9/1994 | Preslar et al. | 327/436 |
| 5,506,539 | 4/1996 | Kelly et al. | 327/379 |
| 5,550,497 | 8/1996 | Carobolante | 327/110 |
| 5,555,149 | 9/1996 | Wert et al. | 361/56 |
| 5,576,635 | 11/1996 | Partovi et al. | 326/27 |
| 5,646,809 | 7/1997 | Motley et al. | 361/56 |
| 5,671,179 | 9/1997 | Javanifard | 365/185.33 |
| 5,680,068 | 10/1997 | Ochi et al. | 327/333 |
| 5,717,343 | 2/1998 | Kwong | 326/27 |
| 5,825,236 | 10/1998 | Seevinck et al. | 327/538 |
| 5,841,714 | 11/1998 | Sher et al. | 365/201 |
| 5,852,540 | 12/1998 | Haider | 326/81 |

OTHER PUBLICATIONS

Connor et al., "Dynamic Dielectric Protection for I/O Circuits Fabricated in a 2.5V CMOS Technology Interfacing a 3.3V LVTTL Bus," *1997 Symposium on VLSI Circuits Digest of Technical Papers*, pp. 119–120.

*Primary Examiner*—Dinh T. Le
*Attorney, Agent, or Firm*—Townsend and Townsend and Crew LLP

[57] ABSTRACT

Various methods and circuitry for implementing output buffers with low voltage CMOS transistors capable of handling signal overshoot and undershoot conditions at an external terminal are disclosed. The present invention detects the level of the signal at the external terminal and adjusts the voltage at the gate terminals of the output transistors connecting to the external terminal in response thereto, such that oxide stress conditions are alleviated. In one embodiment, dynamic biasing techniques are developed by the present invention to ensure that the circuitry protecting the output devices is itself protected against voltage stress caused by overshoot and undershoot at the external terminal.

20 Claims, 8 Drawing Sheets

DYNAMIC BIASING FOR OVERSHOOT AND UNDERSHOOT PROTECTION CIRCUITS

BACKGROUND OF THE INVENTION

The present invention relates in general to integrated circuits, and in particular to a number of circuit techniques that protect output transistors from signals experiencing overshoot and undershoot at the output node and bias voltage generators for such circuits.

In the field of semiconductor technology, there is continued research and development efforts focused on building next generation devices that are smaller and faster. Reduction in power consumption is another objective of the circuit designers as the demand for battery operated portable electronic devices continues to grow. To reduce power consumption, circuits are being designed with ever decreasing power supply voltages. The current state of the art is pushing the level of the power supply voltages to as low as 1.9 volts for microprocessor circuits and the like. On the other hand, to make integrated circuits faster, field effect transistors are being manufactured with thinner gate oxide layers which limit the voltage swing across the transistor. The maximum tolerable voltage across a transistor in a low voltage circuit that is made up of fast, thin oxide transistors, may in fact be limited to the power supply voltage level. Thus, such a circuit operating with, for example, 1.9 volt supply voltage, must ensure that none of the transistors are subject to voltages greater than 1.9 volts. While protection against voltage stress conditions for transistors that are internal to an integrated circuit may not be an issue, transistors in the input/output (I/O) circuitry may well be exposed to larger than expected external signals.

A typical CMOS output buffer is made up of a CMOS inverter having a p-channel pull-up transistor connected to an n-channel pull-down transistor. The common drain terminal of the two devices connects to an external terminal that is typically connected to other circuitry via a transmission line. Mismatches in the impedance of drivers and transmission lines give rise to signal overshoot and undershoot conditions on the transmission lines. Thus, the output transistors may experience voltages greater than that allowed by the process causing reliability problems and damage to output transistor gate oxide. A common prior art technique has been to insert cascode devices in series with the I/O transistors such that any one transistor experiences less of the overshoot or undershoot. However, such cascode devices limit the speed of the output driver and, at lower power supply voltages, severely limit the output swing of the circuit.

There is therefore a need for an output buffer circuit that can be implemented with low voltage transistors and can that safely withstand overshoot or undershoot conditions.

SUMMARY OF THE INVENTION

The present invention provides method and circuitry for implementing output buffers with low voltage CMOS transistors capable of handling signal overshoot and undershoot conditions at an external terminal. Broadly, the present invention detects the level of the signal at the external terminal and adjusts the voltage at the gate terminals of the output transistors connecting to the external terminal in response thereto, such that oxide stress conditions are alleviated. This is accomplished by controlling the gate voltage of the output transistor such that it tracks the output signal during an overshoot or an undershoot. By limiting the tracking function to predefined ranges of the overshooting or undershooting external signal, the present invention ensures that normal operation of the buffer circuit is not disrupted. In one embodiment, dynamic biasing techniques are developed by the present invention to ensure that the circuitry protecting the output devices is itself protected against voltage stress caused by overshoot and undershoot at the output terminal.

Accordingly, in one embodiment, the present invention provides a method for protecting a field effect transistor against voltage stress conditions, the transistor having a first source/drain terminal coupled to an external terminal and a second source/drain terminal coupled to a power supply terminal, the method including the step of coupling the external signal on the external terminal to a gate terminal of the field effect transistor when the voltage level of the external signal crosses a predetermined voltage level. In a more specific embodiment, the method includes a step of applying to the gate terminal of the field effect transistor a signal that substantially tracks the level of the external signal as long as the external signal remains beyond the predetermined voltage level.

In another embodiment, the present invention provides in an output buffer circuit having a p-channel pull-up transistor and an n-channel pull-down transistor with a commonly-coupled source/drain terminals coupled to an external terminal, a method for protecting the p-channel and n-channel transistors against voltage stress conditions including the steps of coupling the external signal on the external terminal to a gate terminal of the p-channel pull-up transistor for the duration the external signal undershoots below a predetermined level, and coupling the external signal to a gate terminal of the n-channel pull-down transistor for the duration the external signal overshoots above a predetermined level.

In yet another embodiment, the present invention provides a method for protecting an output driver transistor against voltage stress conditions including the steps of providing a first current path to pull a gate terminal of the output driver transistor to a first voltage level for a fast turn on of the transistor, disconnecting the first current path after expiration of a pulse of short duration, and providing a second current path at the gate terminal of the output driver transistor that allows the voltage at the gate terminal to move to a second voltage level closer to the output voltage level.

In a further embodiment, the present invention provides a method for generating a bias voltage for a gate terminal of a field effect transistor (FET) having a first source/drain terminal coupled to an external terminal and a second source/drain terminal coupled to a logic level. The method according to this embodiment includes the steps of generating a desired bias voltage at the gate terminal of the FET by a reference voltage generating circuit; detecting when a signal at the external terminal has crossed a predetermined voltage level and generating a detect signal in response thereto; disabling the reference voltage generating circuit in response to the detect signal; and pulling the gate terminal of the FET to a voltage closer to that of the external signal in response to the detect signal.

A better understanding of the nature and advantage of the output buffer circuit of the present invention may be had with reference to the detailed description and drawings below.

DESCRIPTION OF THE PREFERRED EMBODIMENT

Figure 1:
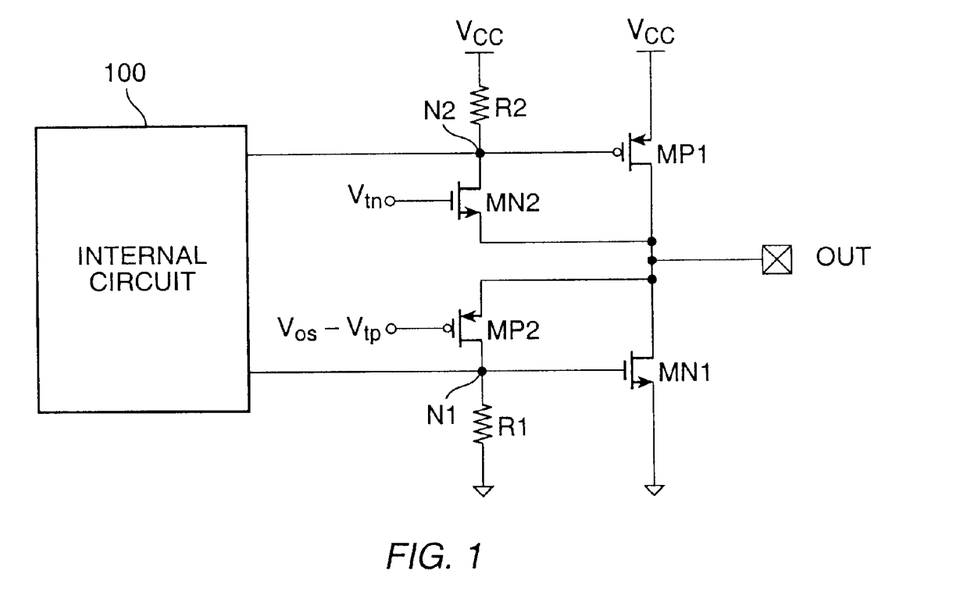
FIG. 1 is a simplified circuit schematic of an exemplary embodiment of the present invention.

Referring to FIG. 1, there is shown a simplified schematic of an exemplary circuit implementation of one embodiment of the present invention. Output transistors MP1 and MN1 provide the pull-up and pull-down drive, respectively, as well as tri-state functionality, in response to signals from internal circuit 100. The circuitry that protects transistor MN1 from an overshooting signal at output terminal OUT includes p-channel transistor MP2 that connects OUT to the gate terminal of MN1 (node N1) when conductive, and a resistive element R1 that sets up the quiescent current for MP2. The circuitry that protects transistor MP1 from an undershooting signal at output terminal OUT includes n-channel transistor MN2 that connects OUT to the gate terminal of MP1 (node N2) when conductive, and a resistive element R2 that sets up the quiescent current for MN2.

For illustrative purposes, the power supply terminals of the circuit of FIG. 1 are connected to 1.9 volt (Vcc) and ground. In this exemplary embodiment, the power supply voltage of 1.9 volts is the maximum acceptable voltage across any transistor as defined by the fabrication process, beyond which damage may occur to the transistor oxide layer. The gate terminal of MP2 receives a voltage equal to Vos-Vtp, where Vos is the voltage level above which a signal is in overshoot condition (in this exemplary case Vos=Vcc= 1.9v), and Vtp is the threshold voltage for the p-channel transistor. The gate terminal of MN2 receives a voltage equal to Vtn, the threshold voltage for the n-channel transistor.

Figure 2:
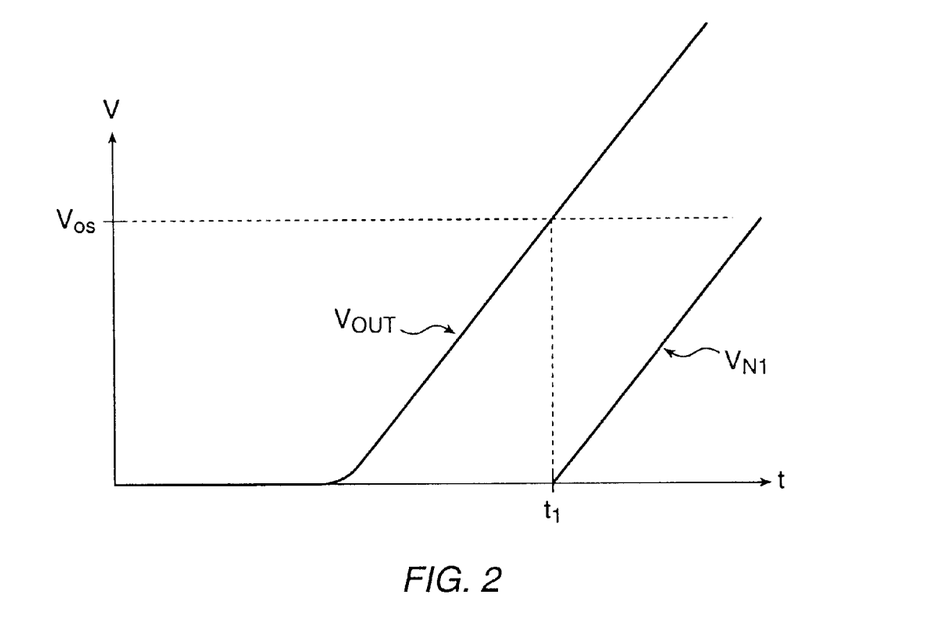
FIG. 2 is a timing diagram illustrating the operation of the circuit of FIG. 1.

The operation of the circuit of FIG. 1 will be described hereinafter in connection with FIG. 2. When the circuit is not driving the output (i.e., in receive mode), internal circuit 100 supplies a low voltage to node N1 to keep MN1 in an off state and a high voltage to node N2 to keep MP1 in an off state. If the signal Vout at output terminal OUT overshoots past the exemplary Vos value of 1.9 volts, p-channel transistor MP2 is turned on coupling Vout to node N1. This will cause the voltage at node N1, V(N1), to track Vout. FIG. 2 shows the cross-over point occurring at time t1 when V(N1) starts to track the signal Vout. This ensures that the voltage differential across MN1 remains around 1.9 volts to avoid any over-voltage damage to MN1's oxide layer. An additional advantage of this circuit is that by turning on pull-down transistor MN1, it operates to counter-act the overshoot condition. The upper half of the circuit operates similarly, wherein MN2 turns on when Vout drops below ground (i.e., undershoots), coupling Vout to the gate terminal of MP1. MP1 thus turns on to ensure a voltage not larger than a maximum of 1.9 volts across it, while helping to counter-act the undershoot condition.

Thus, there are three modes of operation for the output buffer circuit of FIG. 1: during a normal drive (or transmit) mode, output transistors MP1 and MN1 respond to signals from internal circuit 100; in a tri-state (or receive) mode and when not overshooting or undershooting, MP1 and MN1 receive Vcc and ground at their gate terminals, respectively, to keep them in an off state; and finally when in tri-state mode but experiencing undershoot or overshoot conditions at OUT, the gate terminal of MP1 tracks OUT when undershooting, the gate terminal of MN1 tracks OUT when overshooting.

Figure 3:
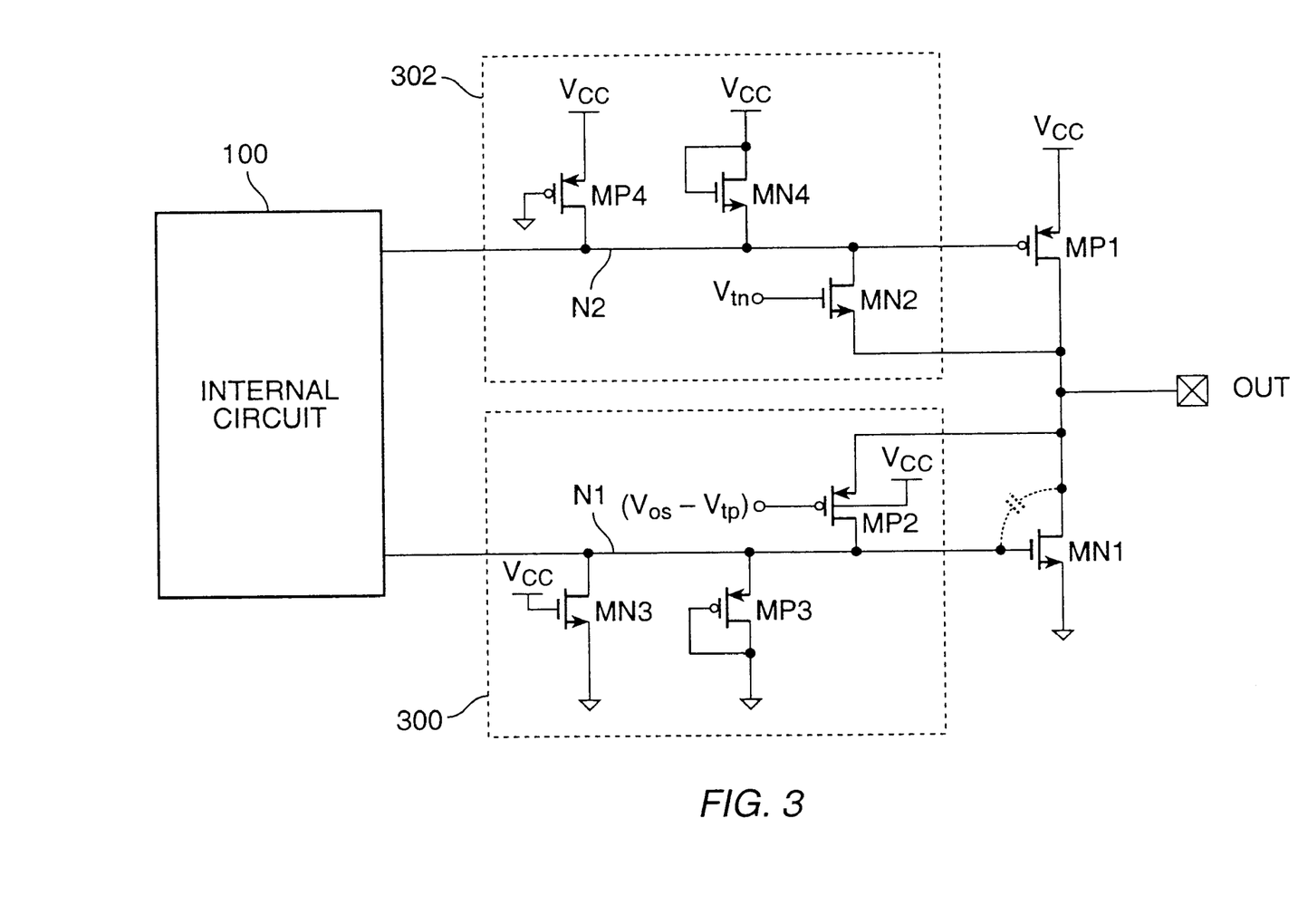
FIG. 3 is a circuit schematic showing the details of the overshoot and undershoot protection circuitry according to an exemplary embodiment of the present invention.

FIG. 3 is a circuit schematic showing the details of the overshoot and undershoot protection circuitry according to an exemplary embodiment of the present invention. The same reference numerals are used herein to refer to the same elements in all of the Figures. As shown in FIG. 3, in overshoot protection circuit 300, resistor R1 (FIG. 1) is preferably replaced by a p-channel transistor MP3 as it provides better tracking of MP2 over process and temperature variations. Transistor MP3, however, stops conducting and thus clamps the voltage at node N1 when it reaches one Vtp. Under worst case process conditions where Vtp and Vtn may be in opposite process corners, and considering the impact of body effect on Vtp of MP3, |Vtp| of MP1 may in fact exceed |Vtn| of MN1. This is undesirable as it would cause MN1 to turn on when the mode of operation requires it to be off. To remedy this condition, overshoot circuit 300 adds an n-channel pull-down transistor MN3 connected in parallel with MP3 that ensures the voltage at node N1 remains below the Vtn of MN1 (the voltage at N1 would be at zero in steady state condition). For easier understanding of the operation of the circuit, the gate terminals of transistors MP3 and MN3 are shown in the simplified embodiment of FIG. 3 as being connected to ground and Vcc, respectively. In a preferred embodiment, however, the gate terminals of these two transistors are driven by internal circuit 100, exemplary embodiments of which are shown below in connection with FIG. 6.

Transistor MN3 is made relatively small in size so that its pull-down drive can be overcome by Vout feeding back through the large gate-to-source parasitic capacitance of MN1 (shown in phantom), as well as by transistor MP2 during overshoot at the external terminal OUT. Transistor MP2 is sized such that it is large enough to drive node N1 up in case of overshoot, yet small enough to minimize feedback of the output signal through it's gate-to-source parasitic capacitance (not shown). A weak transistor MN3 allows the voltage at node N1 to be pulled up by MN1's gate-to-source parasitic capacitance by about, e.g., 100 mV to 150 mV when Vout moves up. This voltage provides additional margin for MN1 against the overshooting output voltage, but is small enough to ensure that MN1 does not unintentionally turn on. The gate terminals of MP3 and MN3 are shown as connecting to ground and Vcc, respectively, providing a given on-resistance. These transistors, however, can be driven by logic circuitry from internal circuit 100 to achieve the same result in the various modes of operation.

Undershoot protection circuit 302 is constructed similar to overshoot protection circuit 300, but with opposite polarity devices. The same design considerations in terms of device sizes and connectivity applies to undershoot protection circuit 302 which operates similar to overshoot protection circuit 300.

The reference voltages (Vos-Vtp) and Vtn that bias transistors MP2 and MN2, respectively, can be generated using bias voltage generating techniques. Because these transistors also connect to output node OUT, in a preferred embodiment, these reference voltages are generated such that they are also protected from overshooting and undershooting signals at OUT. Exemplary embodiments for dynamic bias voltage generators for the undershoot and overshoot protection circuits will be described further below in connection with FIGS. 8 and 9.

Because of the potential that driver transistors MN1 and MP1 may start driving the output terminal (OUT) when the circuit is in fact in receive mode, the undershoot and overshoot circuitry shown in FIG. 3 are preferably designed such that the driver transistors (MN1 and MP1) are turned off quickly when the overshoot or undershoot condition dies out. In an improved embodiment of the present invention, circuitry is added to ensure a quick turn off of the driver transistors when undershoot or overshoot dissipates. According to this embodiment, the moment at which the undershoot or overshoot condition disappears, additional circuitry connected in parallel with the protection circuits is activated to quickly turn off the respective driver transistors. In a yet further improved embodiment, this additional circuitry is activated only for a short time to allow the protection circuits to quickly resume their tracking function in case of ringing of Vout around the critical voltage. The nature of these embodiments of the present invention will be better understood in view of the following description of exemplary circuit implementations shown in FIGS. 4 and 5.

Figure 4:
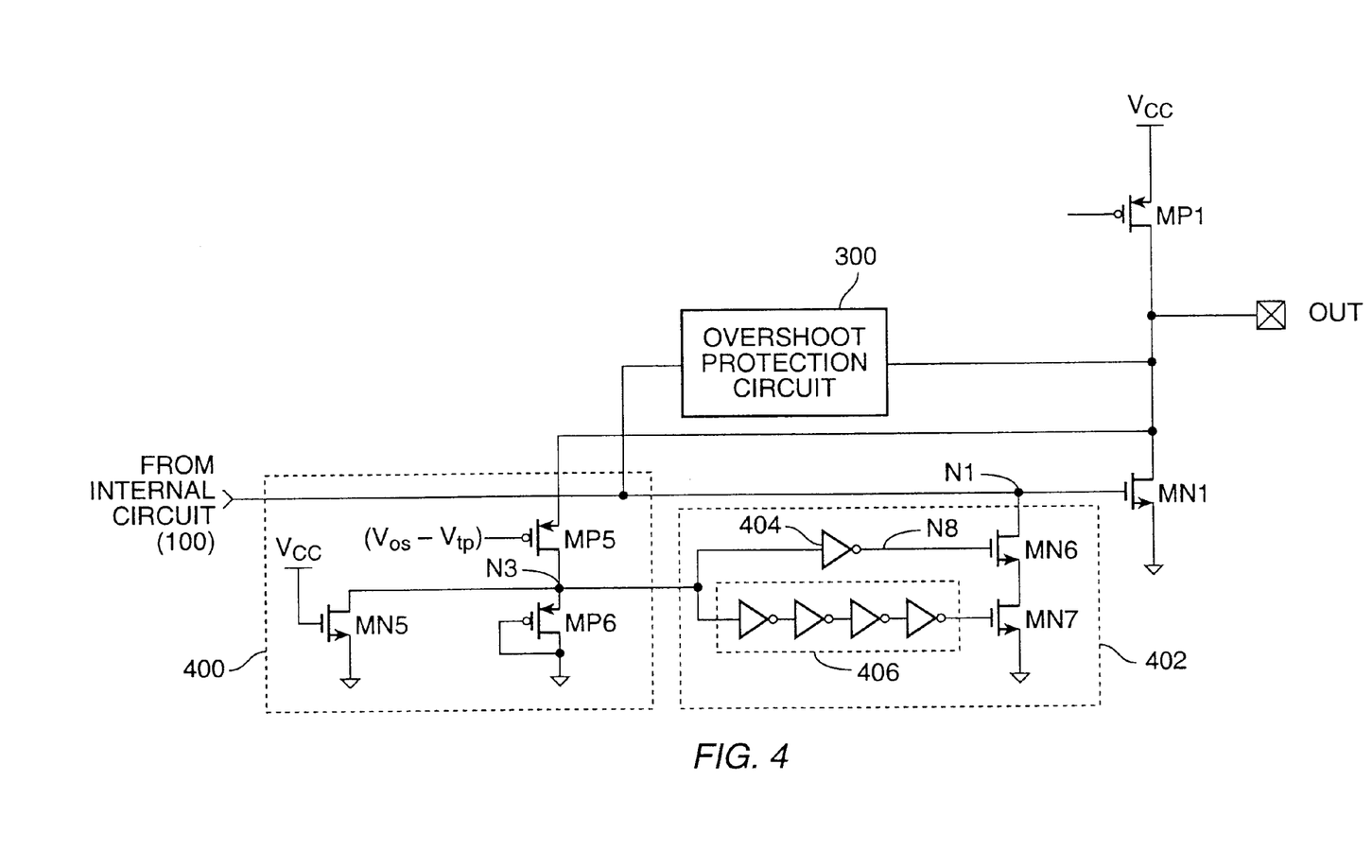
FIG. 4 is an exemplary circuit implementation to accomplish quick turn off of pull-down output driver transistor when overshoot dies out.

Referring to FIG. 4, there is shown an exemplary circuit implementation to accomplish the quick turn off of pull-down output driver transistor MN1 when overshoot dies out. This circuit includes an overshoot detection circuit 400 with three transistors MP5, MP6 and MN5 that are connected in a fashion identical to the three transistors in the overshoot protection circuit 300 (FIG. 3) except that instead of driving the gate terminal of MN1, the common node between the three transistors (node N3) drives a fast auxiliary pull-down circuit 402. Overshoot detection circuit 400 operates essentially the same as overshoot protection circuit 300 of FIG. 3. Its primary function, however, is different in that instead of providing any protection, it generates a logic output signal at node N3 signaling whether Vout is in overshoot or not. These transistors are therefore preferably sized for faster response to the level of voltage at OUT.

In an exemplary embodiment, auxiliary pull-down circuit 402 includes two serially-connected n-channel transistors MN6 and MN7 that connect between node N1 (gate of MN1) and ground. The gate terminal of MN6 receives the output of overshoot detection circuit 400 (node N3) via an inverter 404, while the gate terminal of MN7 connects to node N3 via a delay element 406 that is made up of, for example, four serially-connected inverters. In operation, when there is no overshoot at OUT, transistor MP5 is off, allowing transistors MP6 and MN5 to pull node N3 to ground. With N3 at ground, transistor MN6 is turned on but transistor MN7 is off, disconnecting the auxiliary pull-down path. When Vout rises above 1.9 volts (i.e., overshoots), transistor MP5 turns on pulling node N3 high. With N3 at a high voltage, transistor MN6 turns off and transistor MN7 turns on with some delay. Thus, there is still no current path between N1 and ground. Overshoot protection circuit 300, however, is operating to allow the voltage at N1 track Vout thus protecting MN1 from over-voltage condition.

When overshoot starts to die and as soon as it reaches back down to 1.9 volts, MP5 turns off and node N3 is pulled back down to ground. With N3 at ground, MN6 turns on quickly, but MN7 does not turn off until four inverter delays later. Thus, for an amount of time equal to the delay of circuit 406, both transistors MN6 and MN7 are on pulling node N1 down to ground. This builds hysterises into the operation of the auxiliary pull-down circuit and ensures a fast turn off of transistor MN1 as soon as overshoot dies. Transistors MN6 and MN7 are preferably relatively larger in size to pull node N1 down to ground fast. The delay which sets the on time of the current path is preferably short enough to allow node N1 resume tracking of Vout in case Vout oscillates right around the critical voltage (in this case 1.9 volts) due to ringing effects.

Figure 5:
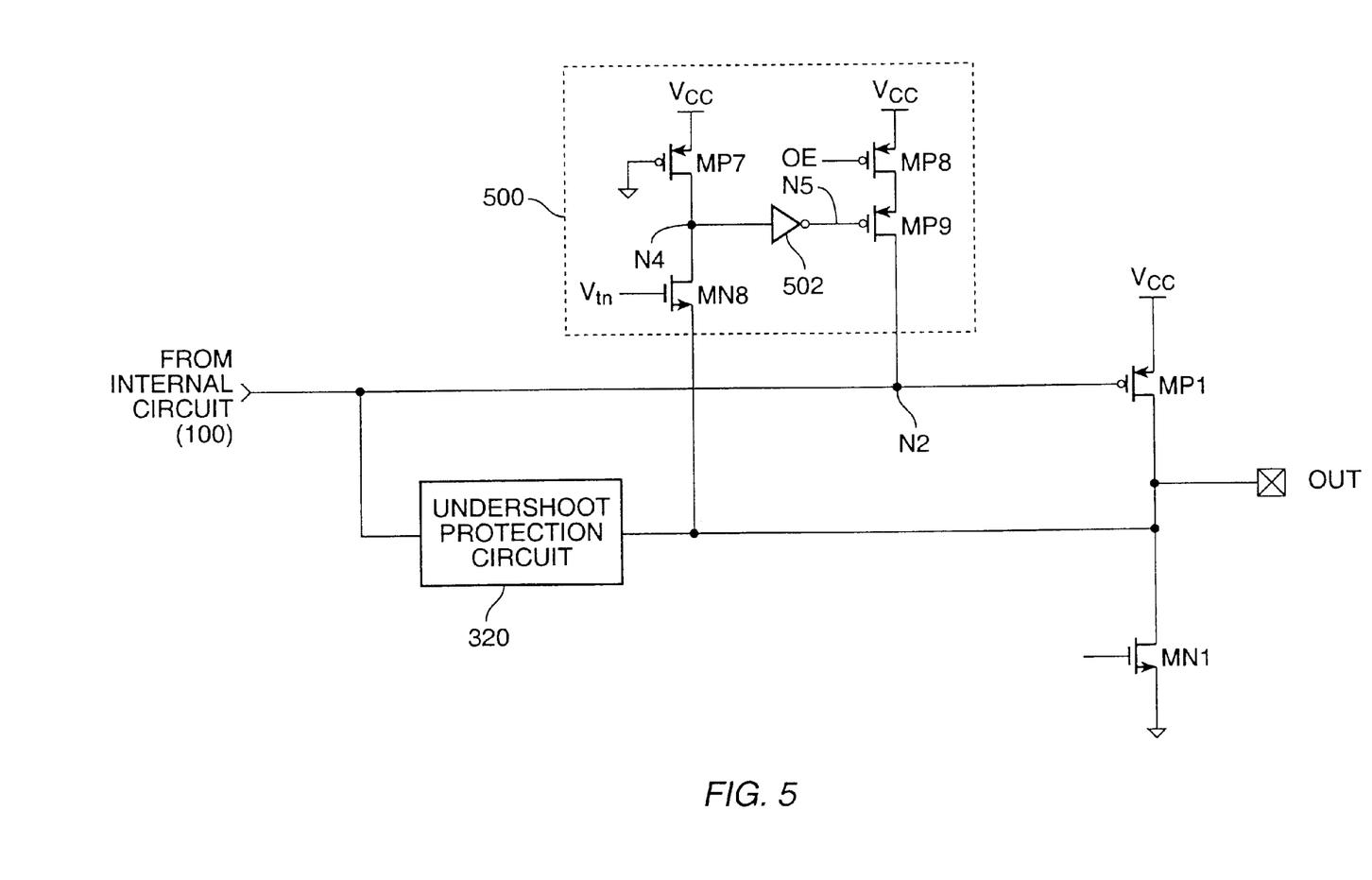
FIG. 5 is an exemplary circuit implementation to accomplish quick turn off of pull-up output driver transistor when undershoot dies out.

To ensure quick turn off of the pull-up driver transistor MP1, circuitry similar to that used for MN1 but with opposite polarity can be utilized. Referring to FIG. 5, there is shown an exemplary circuit 500 to accomplish the quick turn off of pull-up output driver transistor MP1 when undershoot dies out. In the embodiment shown in FIG. 5, an alternative circuit implementation without hysterises is disclosed where the auxiliary pull-up circuit is switched rather than pulsed. Circuit 500 includes transistors MN8 and MP7 that detect the undershoot condition in the same way undershoot protection circuit 302 operates. A serially-connected pair of p-channel pull-up transistors MP8 and MP9 connect the gate of output driver MP1 to Vcc. The gate terminal of MP9 connects to the common node of MP7 and MN8 (node N4) via an inverter 502, while the gate terminal of MP8 connects to an output enable signal OE. Because the pull-down driver transistor MN1 has a stronger drain-to-substrate clamp diode, it permits a relatively smaller undershoot as compared to the level of overshoot. Furthermore, undershoot detect circuit 500 uses an n-channel transistor (MN8) that is inherently faster than a p-channel transistor (MP5 in FIG. 4). For these reasons a simpler auxiliary circuit (without hysterises) may be used to ensure fast turn off of MP1 when undershoot disappears.

In operation, when there is no undershoot, transistor MN8 is off allowing MP7 to pull node N4 up to Vcc. As a result, transistor MP9 turns on and with OE low (i.e., receive mode), transistor MP8 is also on. Under this condition, therefore, a current path is provided between node N2 and Vcc pulling node N2 to Vcc and ensuring that driver transistor MP1 remains off. When Vout drops below ground (undershoots), transistor MN8 turns on pulling node N4 low. This causes transistor MP9 to turn off after one inverter (502) delay disconnecting the auxiliary pull-up path. During this time, undershoot protection circuit 302 allows node N2 to track Vout, thus protecting MP1 against voltage stress. When the undershooting signal moves back up toward ground and reaches ground potential, transistor MN8 turns off, and transistor MP9 turns back on again. This causes a fast pull-up of node N2 to achieve a fast turn off of transistor MP1 as soon as undershoot dies out.

FIGS. 4 and 5 show two embodiments that are different in implementation to achieve fast turn off of the output driver transistor when the overshoot and undershoot conditions disappear. It is to be understood, however, that the same embodiment (or circuitry similar thereto) can be used for both driver transistors. The differences in the embodiments shown in FIGS. 4 and 5 optimize the circuitry in terms of area and speed for each driver transistor in the particular exemplary implementation used herein for illustrative purposes.

Thus far, output transistor protection circuitry against undershoot and overshoot have been described when the output driver is in receive mode. There is, however, the possibility of experiencing undershoot and overshoot when the circuit is in drive mode. This may be the case, for example, when there is signal reflection across the transmission line. Power supply surges caused by concurrent switching of multiple output buffers is another cause of undershoot or overshoot when in driver mode. Because in drive mode, at any given time, one of the driver transistors (MN1 or MP1) is on, protection circuitry in addition to the receive mode protection circuitry is required. That is, for example, when the output pad OUT is to be driven low, a high voltage is applied to the gate of pull-down transistor MN1 to turn it on while pull-up transistor MP1 is turned off. Under this condition, both output driver transistors are in danger of gate oxide stress in case of output undershoot. The receive mode undershoot protection circuit 302 as shown in FIG. 3 can operate to protect transistor MP1 in drive mode also since the biasing condition is the same. However, additional circuitry is needed to protect pull-down transistor MN1.

In yet another embodiment of the present invention, circuitry is provided to protect the output driver transistors against undershoot and overshoot when in drive mode. When turning on an output driver transistor, instead of driving the gate terminal of the driver transistor to the appropriate logic level (high for MN1 and low for MP1) and maintaining it, the present invention provides a means to strongly pull the gate to the desired level for an initial period and then allowing it to move in the direction of the output signal to alleviate the overshoot or undershoot condition.

Figure 6:
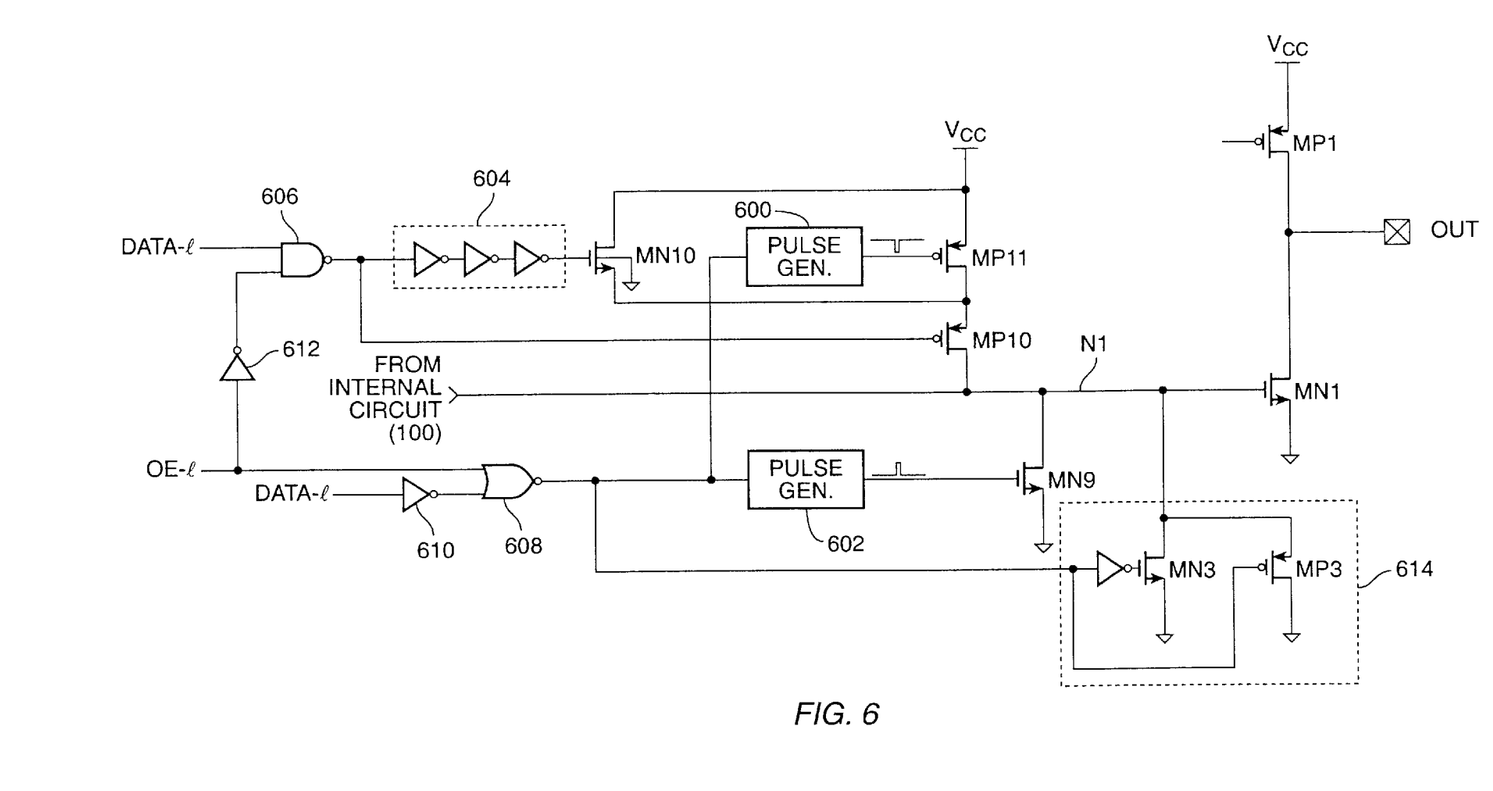
FIG. 6 is an exemplary circuit implementation for protection against undershoot when the output driver is in drive mode.

Referring to FIG. 6, there is shown one exemplary implementation according to this embodiment of the present invention for an undershoot protection circuit that protects pull-down driver transistor MN1 when in drive mode. When driving OUT to a logic low level, two p-channel transistors MP10 and MP11 pull the gate of MN1 (node N1) up to Vcc in response to a logic high level at Data__1, and a logic low at OE__1 (i.e., drive mode). Under this condition, transistor MP10 is always on, but the gate of transistor MP11 receives a negative pulse supplied by pulse generator 600. Pulse generator 600 generates the negative pulse when Data__1 transitions from logic low to high. Thus, upon Data__1's transition from logic low to logic high, both MP10 and MP11 turn on pulling node N1 (gate of MN1) to Vcc. This provides for a strong and fast turn on of MN1 to pull OUT low quickly. However, as soon as the negative pulse returns to a high level, transistor MP11 turns off, and the high level at node N1 is maintained by MP10 and an n-channel transistor MN10 that is connected in parallel with MP11. N-channel transistor MN10 allows the large source-to-gate parasitic capacitor of driver transistor MN1 to pull node N1 down by about one Vtn (n-channel threshold voltage) which is larger than its nominal Vtn value due to body effect. An inverting delay block 604 made up of serially-connected chain of three inverters is inserted in the path to the gate of MN10 to prevent pull-down transistor MN1 from turning on before pull-up transistor MP1 turns off. Because MN10 switches off only after a delay, transistor MP10 is included to speed up the pull down of node N1 when driver transistor MN1 is to be switched off.

Thus, the voltage at the gate terminal of MN1 is reduced just enough to protect MN1 against oxide stress when Vout undershoots. It is to be noted that the nature and magnitude of undershoot is more limited in drive mode as compared to the magnitude of undershoot in receive mode. That is because the n-channel driver transistor MN1 is on and conducts current when in drive mode. Thus, as Vout drops below ground, at some point current flow through MN1 is reversed, and MN1 is reverse body biased. The voltage drop at the gate terminal of MN1 allowed by MN10 is sufficient to protect MN1 against undershoot when in drive mode.

A second pulse generator 602 drives the gate terminal of n-channel transistor MN9 that connects node N1 to ground when turned on. Transistor MN9 provides for a initially fast pull-down of node N1 in response to a high to low transition of Data__1. Once the pulse is removed, the receive mode overshoot protection circuitry (e.g., block 300 in FIG. 3) takes over to protect MN1 against possible overshoot.

In drive mode, there is also a need to protect the pull-up transistor MP1 against output overshoot. When the output is to be driven high, MP1 is turned on by pulling its gate terminal N2 to a logic low level, and MN1 is turned off by pulling its gate terminal to a logic low level. If Vout overshoots, both of these devices are in danger of experiencing oxide stress. Transistor MN1 is off and therefore the same circuitry that protects it against overshoot in the receive mode (e.g., circuit 300 in FIG. 3) operates to protect it in drive mode as well. Pull-up transistor MP1, however, requires additional circuitry.

Figure 7:
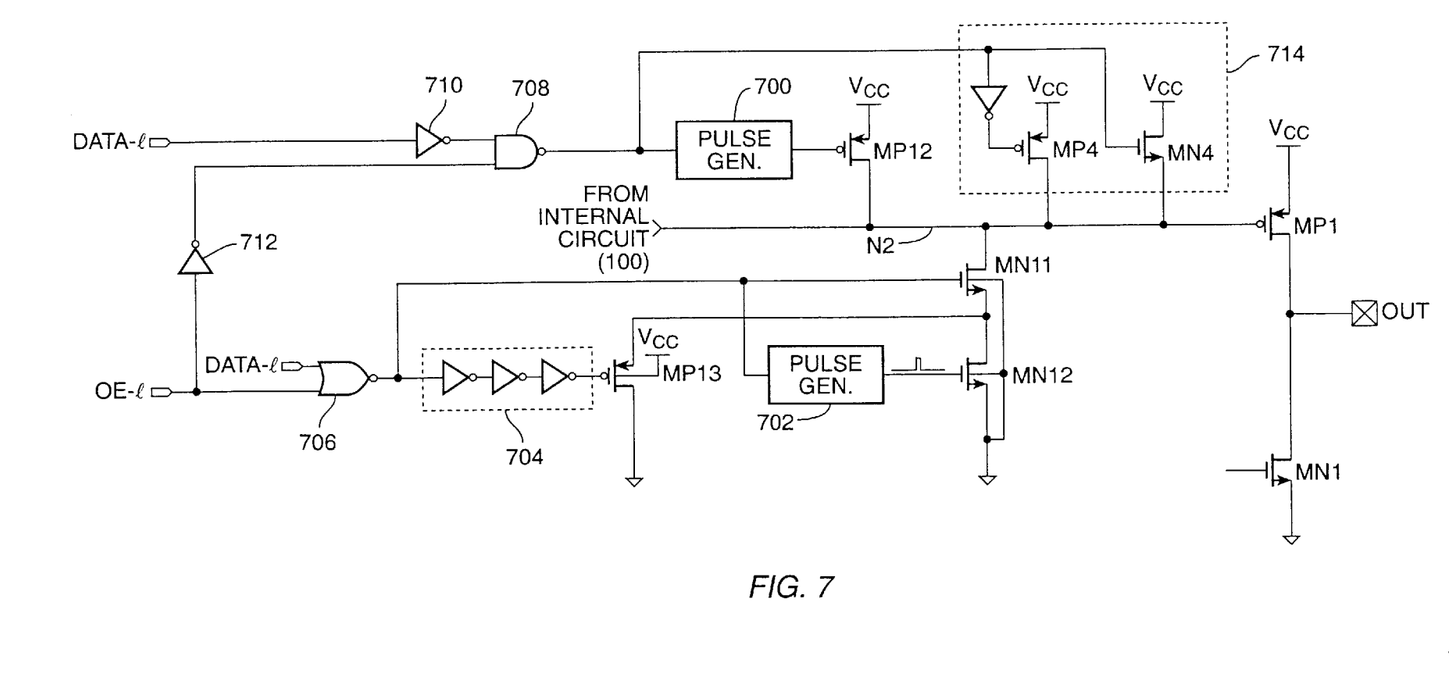
FIG. 7 is an exemplary circuit implementation for protection against overshoot when the output driver is in drive mode.

Referring to FIG. 7, there is shown an exemplary circuit implementation for protecting the pull-up transistor MP1 against overshoot when in drive mode. The principles of operation of this circuit are almost identical to the drive mode undershoot protection circuit shown in FIG. 6, but with polarities reversed. In this circuit, n-channel transistors MN11 and MN12 are turned on to pull node N2 to ground in order to turn MP1 on. Similar to the circuit of FIG. 6, MN12 is pulsed on upon the transition of the data (Data-1) to provide for an initially strong pull down of node N2 to ensure a quick turn on of driver transistor MP1. Once the pulse is removed and MN12 is turned off, a p-channel transistor MP13 helps maintain a low voltage at node N2. However, MP13 will allow Vout to pull node N2 up by one p-channel threshold voltage Vtp that is larger in absolute magnitude than nominal Vtp due to body effect. By thus pulling node N2 up toward the overshooting output voltage, the voltage across MP1 is reduced when Vout overshoots.

As discussed above, in a preferred embodiment, dynamic bias voltage generators are used to generate the bias voltages (Vos-Vtp) and Vtn for the overshoot and undershoot protection circuits, respectively. The need for dynamic biasing arises from the fact that transistors in the overshoot and undershoot protection circuits themselves need protection against voltage stress caused by overshooting and undershooting output signals. That is, transistor MP2, for example, would experience oxide stress when Vout undershoots by for example, about 1 volt. Given an exemplary Vtp of about 0.5 volts, (Vos-Vtp)=1.4 volts, and with Vout=−1 volt, MP2 would have an unacceptable 2.4 volts applied across it. When Vout overshoots there is further possibility of feedback through parasitic source-to-gate capacitance of MP2 increasing the reference value (Vos-Vtp). Therefore, dynamically generated reference voltage would be preferred to bias MP2 and MN2.

Figure 8:
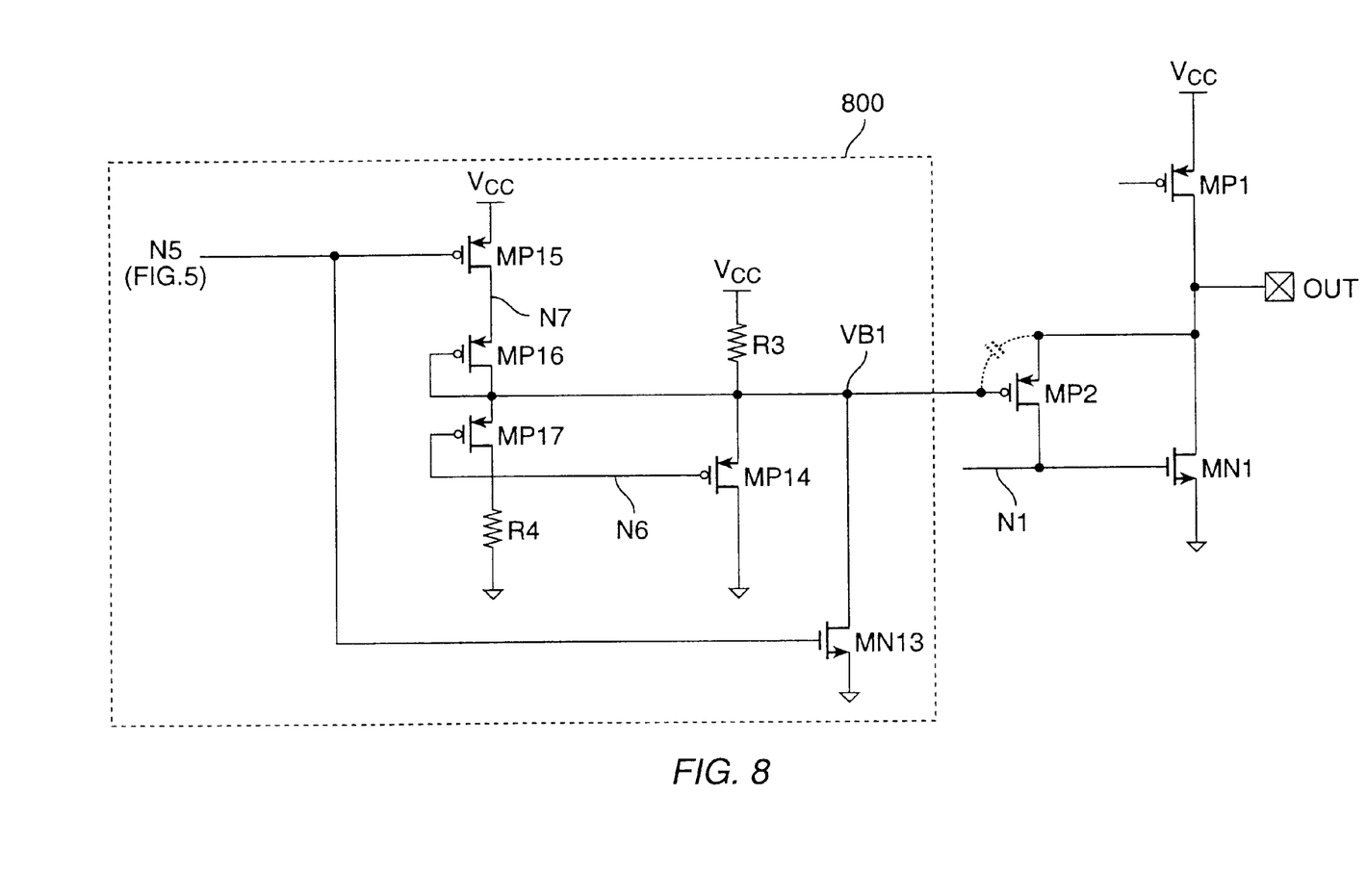
FIG. 8 is an exemplary circuit implementation of a dynamic bias voltage generator for use with the overshoot protection circuit.

Referring to FIG. 8, there is shown an exemplary circuit implementation of a dynamic bias voltage generator 800 for use with the overshoot protection circuit. Bias voltage generator 800 generates VB1=(Vos-Vtp)=(Vcc-Vtp) voltage for the gate terminal of p-channel transistor MP2 in overshoot protection circuit 300 (FIG. 3). The circuit includes a string of p-channel transistors MP15, MP16, MP17 that connect Vcc to ground via a resistive element R4. Resistive element R4 is preferably implemented by a small p-channel (gate-drain connected) transistor. Transistor MP15 receives a logic signal representing the logical inverse of an undershooting Vout at its gate terminal, and acts as a switch in response thereto. A logic signal representing the logical inverse of an undershooting Vout is in fact available at the output of inverter 502 (node N5) in FIG. 6. Transistors MP16 and MP17 are gate-drain connected, each providing for essentially a Vtp voltage drop. Thus, when MP15 is switched on such that node N7 is at Vcc, MP16 brings node VB1 to Vcc-Vtp, and MP17 brings node N6 to Vcc-2Vtp. Node N6 connects to a gate terminal of another p-channel transistor MP14 that connects between VB1 and ground. A resistive element R3 pulls the source of MP14 (i.e., node VB1) to Vcc. Resistive element R3 is also preferably another gate-drain connected p-channel transistor of small size. An n-channel transistor MN13 also connects between VB1 and ground, and receives a logical inverse of an undershooting Vout (e.g., node N5 of FIG. 6) at its gate terminal.

Referring back to FIG. 6, when Vout is not experiencing overshoot or undershoot, node N4 is pulled high by transistor MP7, and node N5 is pulled low by inverter 502. With N5 at a logic low level, transistor MP15 is turned on and transistor MN13 is turned off. Node VB1 is thus pulled to Vcc-Vtp by MP15 and MP16. Transistors MP16 and MP17 are much larger in size and thus easily overpower resistive element R4. Transistor MP2 is thus biased at the desired level of Vcc-Vtp.

Transistor MP2 is subject to oxide stress when Vout undershoots. However, according to the present invention, as soon as Vout undershoots below ground, transistor MN8 in FIG. 6 turns on resulting in node N5 being pulled to a logic high level. With N5 at a logic high level, transistor MP15 turns off and transistor MN13 turns on. Accordingly, transistor MN13 quickly brings node VB1 down to ground. By thus moving the voltage at the gate terminal of MP2 to ground when Vout undershoots, even if Vout (i.e., source terminal of MP2) drops to as low as −1 or −1.5 volts, MP2 will not experience oxide stress. Since MP2's primary function is to protect pull-down driver transistor MN1 against Vout overshoot, there is no need for MP2 to receive a bias voltage when Vout is in undershoot condition.

Due to feedback through the gate-to-source parasitic capacitance of MP2 (shown in phantom in FIG. 8), the bias voltage at VB1 may fluctuate as Vout moves up and down. Any downward movement of Vout fed back to VB1 can be counteracted by transistor MP16 which can be designed with a relatively large size. However, VB1 must also remain stable as Vout transitions upwards. This is accomplished by transistor MP14. When Vout is not undershooting, the gate terminal of MP14 (node N6) is biased to Vcc-2Vtp and it's source terminal is biased to Vcc-Vtp, as discussed above. Thus, when feedback through the parasitic capacitance attempts to move VB1 upwards, a relatively large transistor MP14 turns on pulling VB1 back to Vcc-Vtp. Accordingly, bias voltage generator 800 not only generates a dynamic bias voltage at VB1 that protects MP2 against oxide stress, it generates a very stable bias voltage that does not fluctuate with variations in Vout.

Figure 9:
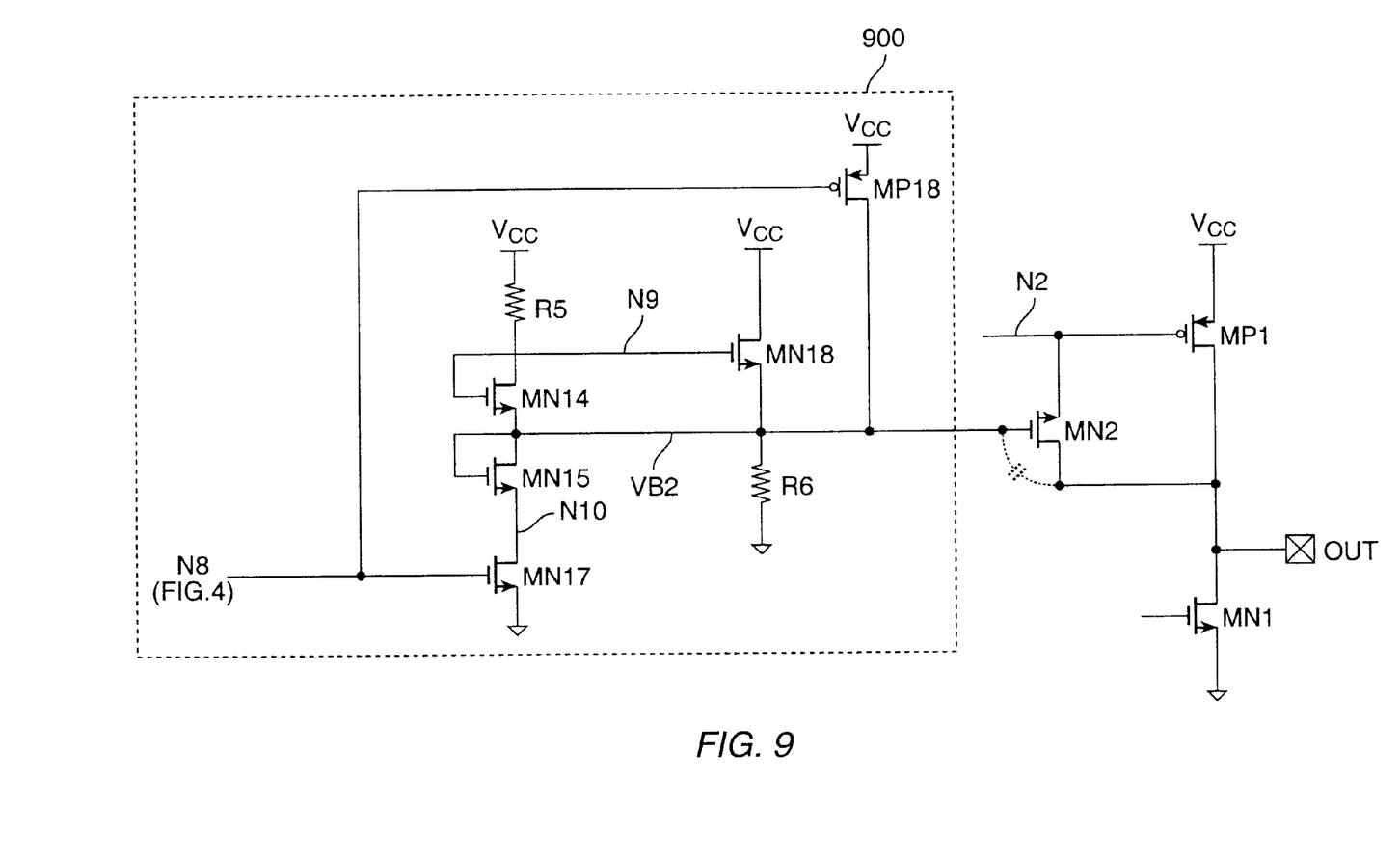
FIG. 9 is an exemplary circuit implementation of a dynamic bias voltage generator for use with the undershoot protection circuit.

An exemplary circuit implementation of a dynamic bias voltage generator 900 for the undershoot protection circuit (302 in FIG. 3) according to one embodiment of the present invention is presented in FIG. 9. Dynamic bias voltage generator 900 generates bias voltage VB2-Vtn for the gate terminal of undershoot protection transistor MN2 of FIG. 3. The circuit is constructed very similarly to dynamic bias voltage generator 800 of FIG. 8 except that all polarities are reversed. That is, the string of transistors includes three n-channel transistors MN14 and MN15 and MN17 that connect ground to Vcc via a resistive element R5. Resistive element R5 is implemented by the on-resistance of a small drain-gate connected n-channel transistor in a preferred embodiment. VB2 is normally biased at one Vtn by the string of transistors and node N9 is based at 2Vtn. When Vout overshoots, transistor MN17 turns off and transistor MP18 turns on (in response to the signal at node N8 of the circuit shown in FIG. 4). The string of transistors is disconnected from ground by MN17, and VB2 is pulled up to Vcc by MP18. This ensures that transistor MN2 does not experience oxide stress. Similar to the circuit of FIG. 8, stability of the level of VB2 is ensured by a strong MN15 when Vout transitions upwards, and by MN18 turning on when Vout transitions downward.

In conclusion, the present invention provides method and circuitry for implementing output buffers with low voltage CMOS transistors capable of handling signal overshoot and undershoot conditions at an external terminal. There is further provided dynamic biasing techniques to ensure that none of the transistors in the protection circuitry undergoes oxide stress conditions. It is to be understood that the above describes exemplary embodiments of the present invention for illustrative purposes, and that it is possible to use various alternatives, modifications and equivalents. Therefore, the scope of the present invention should be determined not with reference to the above description but should, instead, be determined with reference to the appended claims, along with their full scope of equivalents.

What is claimed is:

1. A method for generating a bias voltage for a gate terminal of a field effect transistor (FET) having a first source/drain terminal coupled to an external terminal and a second source/drain terminal coupled to an internal node, the method comprising the steps of:

generating a desired bias voltage at the gate terminal of the FET by a reference voltage generating circuit;

detecting when a signal at the external terminal has crossed a predetermined voltage level and generating a detect signal in response thereto;

disabling the reference voltage generating circuit in response to the detect signal; and pulling the gate terminal of the FET to a second voltage closer to that of the external signal in response to the detect signal.

2. The method of claim 1 wherein the predetermined voltage level and the second voltage are substantially equal to a logic low power supply voltage level.

3. The method of claim 1 wherein the predetermined voltage level and the second voltage are substantially equal to a logic high power supply voltage level.

4. A bias voltage generating circuit for generating a bias voltage for a gate terminal of a field effect transistor (FET), the FET having a first source/drain terminal coupled to an external terminal and a second source/drain terminal coupled to an internal node, the circuit comprising:

first and second transistors coupled serially between a logic high power supply terminal and a logic low power supply terminal, and having an output coupled to the gate terminal of the FET;

a feedback circuit coupled between the external terminal and a gate terminal of the first transistor, the feedback circuit being configured to detect a voltage level at the external terminal and to turn off the first transistor in response thereto; and a third transistor having a first source/drain terminal coupled to the gate terminal of the FET, and a gate terminal coupled to the feedback circuit.

5. The bias voltage generating circuit of claim 4 wherein the FET is of p-channel type.

6. The bias voltage generating circuit of claim 5 wherein the first and second transistors are of p-channel type, and the third transistor is of n-channel type, and wherein, the third transistor has a second source/drain terminal coupled to the logic low power supply terminal.

7. The bias voltage generating circuit of claim 6 wherein the feedback circuit generates a logical inverse of a signal at the external terminal.

8. The bias voltage generating circuit of claim 7 wherein the second transistor is drain-gate connected and wherein the circuit further comprises a fourth drain-gate connected transistor of p-channel type coupled in series with the second transistor.

9. The bias voltage generating circuit of claim 8 further comprising a pull-down circuit coupled to the gate terminal of the FET, said pull-down circuit counteracting any upward deviation of the bias voltage at the gate terminal of the FET.

10. The bias voltage generating circuit of claim 9 wherein the pull-down circuit comprises:

a p-channel transistor having a source terminal coupled to the gate terminal of the FET, a drain terminal coupled to the logic low power supply terminal, and a gate terminal coupled to the fourth drain-gate connected transistor; and a resistive element coupled between the source terminal of the p-channel transistor and the logic high power supply terminal.

11. The bias voltage generating circuit of claim 4 wherein the FET is of n-channel type.

12. The bias voltage generating circuit of claim 11 wherein the first and second transistors are of n-channel type, and the third transistor is of p-channel type, and wherein, the selected power supply terminal is the logic high power supply terminal.

13. The bias voltage generating circuit of claim 12 wherein the second transistor is drain-gate connected and wherein the circuit further comprises a fourth drain-gate connected transistor of n-channel type coupled in series with the second transistor.

14. The bias voltage generating circuit of claim 13 further comprising a pull-up circuit coupled to the gate terminal of the FET, said pull-up circuit counteracting any downward deviation of the bias voltage at the gate terminal of the FET.

15. The bias voltage generating circuit of claim 14 wherein the pull-up circuit comprises:

an n-channel transistor having a source terminal coupled to the gate terminal of the FET, a drain terminal coupled to the logic high power supply terminal, and a gate terminal coupled to the fourth drain-gate connected transistor; and a resistive element coupled between the source terminal of the n-channel transistor and the logic low power supply terminal.

16. An output buffer circuit driving an external terminal, comprising:

a driver transistor having a first source/drain terminal coupled to the external terminal, a second source/drain terminal coupled to a first power supply terminal, and a gate terminal;

a feedback transistor having a first source/drain terminal coupled to the external terminal and a second source/drain terminal coupled to the gate terminal of the driver transistor, and a gate terminal; and a bias voltage generating circuit generating a bias voltage coupled to the gate terminal of the feedback transistor, the bias voltage generating circuit comprising:

a reference voltage generator coupled between the first power supply terminal and a second power supply terminal, the reference voltage generator generating a desired bias voltage at an output coupled to the gate terminal of the feedback transistor;

a feedback circuit coupled between the external terminal and the reference voltage generator, the feedback circuit generating a detect signal to disable the reference voltage generator in response to a signal level at the external terminal crossing a predetermined voltage level; and a switch circuit coupled to the feedback transistor and configured to switch a voltage level at the gate terminal of the feedback transistor to a voltage level closer to the signal level at the external terminal in response to the detect signal.

17. The output buffer circuit of claim 16 wherein the driver transistor is of n-channel type and the first power supply terminal couples to a logic low power supply voltage, and wherein the feedback transistor is of p-channel type.

18. The output buffer circuit of claim 16 wherein the driver transistor is of p-channel type and the first power supply terminal couples to a logic high power supply voltage, and wherein the feedback transistor is of n-channel type.

19. The output buffer circuit of claim 17 wherein the feedback circuit disables the reference voltage generator when the signal at the external terminal undershoots below the logic low power supply voltage.

20. The output buffer circuit of claim 19 wherein the feedback circuit disables the reference voltage generator when the signal at the external terminal overshoots above the logic high power supply voltage.

* * * * *